(12) United States Patent
Koo

(10) Patent No.: US 8,649,228 B2
(45) Date of Patent: Feb. 11, 2014

(54) OUTPUT DRIVER AND ELECTRONIC SYSTEM COMPRISING SAME

(75) Inventor: Kyung Hoi Koo, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 4 days.

(21) Appl. No.: 13/342,251

(22) Filed: Jan. 3, 2012

(65) Prior Publication Data

US 2012/0170385 A1 Jul. 5, 2012

(30) Foreign Application Priority Data

Jan. 3, 2011 (KR) .................. 10-2011-0000130

(51) Int. Cl.
*G11C 16/04* (2006.01)
(52) U.S. Cl.
USPC ...................... 365/189.05; 365/193; 365/194
(58) Field of Classification Search
USPC ............ 365/189.05, 193, 194, 233.1, 185.17; 326/85, 87
See application file for complete search history.

(56) References Cited

U.S. PATENT DOCUMENTS

| 6,292,408 | B1 * | 9/2001 | Kawashima et al. ..... 365/189.11 |
| 7,206,230 | B2 * | 4/2007 | Li et al. .................... 365/185.22 |
| 7,317,333 | B1 | 1/2008 | Zhou et al. |
| 7,778,089 | B2 * | 8/2010 | Shin et al. ................ 365/189.05 |

FOREIGN PATENT DOCUMENTS

| KR | 1020070001484 A | 1/2007 |
| KR | 1020090039295 A | 4/2009 |
| KR | 1020100030226 A | 3/2010 |

* cited by examiner

*Primary Examiner* — David Lam
(74) *Attorney, Agent, or Firm* — Volentine & Whitt, PLLC

(57) ABSTRACT

An output driver comprises a pull-up circuit that pulls up an output node to a supply voltage in N successive intervals in response to N pull-up control signals having different phases and a pull-down circuit that pulls down the output node to a ground voltage in M successive intervals in response to M pull-down control signals having different phases.

17 Claims, 21 Drawing Sheets ously to ground of conventional output driver, and noise in an output driver according to an embodiment of the inventive concept.

OUTPUT DRIVER AND ELECTRONIC SYSTEM COMPRISING SAME

CROSS-REFERENCE TO RELATED APPLICATIONS

This application claims priority under 35 U.S.C. §119 to Korean Patent Application No. 10-2011-0000130 filed on Jan. 3, 2011, the disclosure of which is hereby incorporated by reference in its entirety.

BACKGROUND OF THE INVENTION

Embodiments of the inventive concept relate generally to integrated circuit technologies. More particularly, embodiments of the inventive concept relate to output drivers that can be used in various types of integrated circuits such as computing systems and memory systems.

An output driver is a circuit used to transmit one or more output signals from one electronic device (e.g., an integrated circuit) to another. For example, an output driver can be used to transmit output data from a semiconductor memory device to a memory controller or a processor.

In many modern devices, output drivers are used to transmit data at high frequencies. However, high frequency data transmissions tend to be more susceptible to noise and distortion compared with lower frequency data transmissions. Accordingly, as data transmission speeds continue to increase, new techniques may be required to maintain reliability in signals transmitted by output drivers.

SUMMARY OF THE INVENTION

According to one embodiment of the inventive concept, an output driver comprises a pull-up circuit that pulls an output node up to a supply voltage in N successive intervals in response to N pull-up control signals having different phases, and a pull-down circuit that pulls the output node down to a ground voltage in M successive intervals in response to M pull-down control signals having different phases.

According to another embodiment of the inventive concept, an output driver comprises a plurality of driver cells, and a plurality of pre-drivers connected to the plurality of driver cells and configured to control the plurality of driver cells to operate in succession. Each of the plurality of driver cells comprises a pull-up circuit pulling-up an output node to a supply voltage in N successive intervals in response to N pull-up control signals having different phases, and a pull-down circuit pulling-down the output node to a ground voltage in M successive intervals in response to M pull-down control signals having different phases.

According to still another embodiment of the inventive concept, an electronic system comprises a memory device that generates a first data strobe signal, and a memory controller that receives the first data strobe signal and transmits data to the memory device in synchronization with the data strobe signal. The memory controller comprises a delay locked loop that phase-shifts the first data strobe signal by 90° to generate a second data strobe signal, and an output driver having an output node that receives the data, transmits the data to an output node, and connects the output node to a supply voltage during each of N successive intervals determined by the phase difference between the first and second data strobe signals, and further connects the output node to a ground voltage during each of M successive intervals determined by the phase difference between the first and second data strobe signals.

These and other embodiments of the inventive concept can reduce the amount of noise in data signals generated at an output node of an output driver. This can improve the reliability of signals transmitted by the output driver, such as signals transmitted at relatively high frequencies.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

In the description that follows, where a feature is referred to as being "connected" or "coupled" to another feature, it can be directly connected or coupled to the other feature or intervening features may be present. In contrast, where a feature is referred to as being "directly connected" or "directly coupled" to another feature, there are no intervening features present. As used herein, the term "and/or" indicates any and all combinations of one or more of the associated listed items and may be abbreviated as "/".

Although the terms first, second, etc. may be used herein to describe various features, these features should not be limited by these terms. Rather, these terms are used merely to distinguish one feature from another. For example, a first signal could be termed a second signal, and a second signal could be termed a first signal without departing from the teachings presented.

The terminology used herein is for the purpose of describing particular embodiments only and is not intended to be limiting. As used herein, the singular forms "a", "an" and "the" are intended to encompass the plural forms as well, unless the context clearly indicates otherwise. It will be further understood that the terms "comprises" and/or "comprising," or "includes" and/or "including", where used in this specification, specify the presence of stated features, but they do not preclude the presence or addition of one or more other features.

Unless otherwise defined, all terms (including technical and scientific terms) used herein have the same meaning as commonly understood by one of ordinary skill in the art. In addition, terms such as those defined in commonly used dictionaries should be interpreted as having a meaning that is consistent with their meaning in the context of the relevant art and/or this description and should not be interpreted in an idealized or overly formal sense unless expressly so defined herein.

Figure 1:
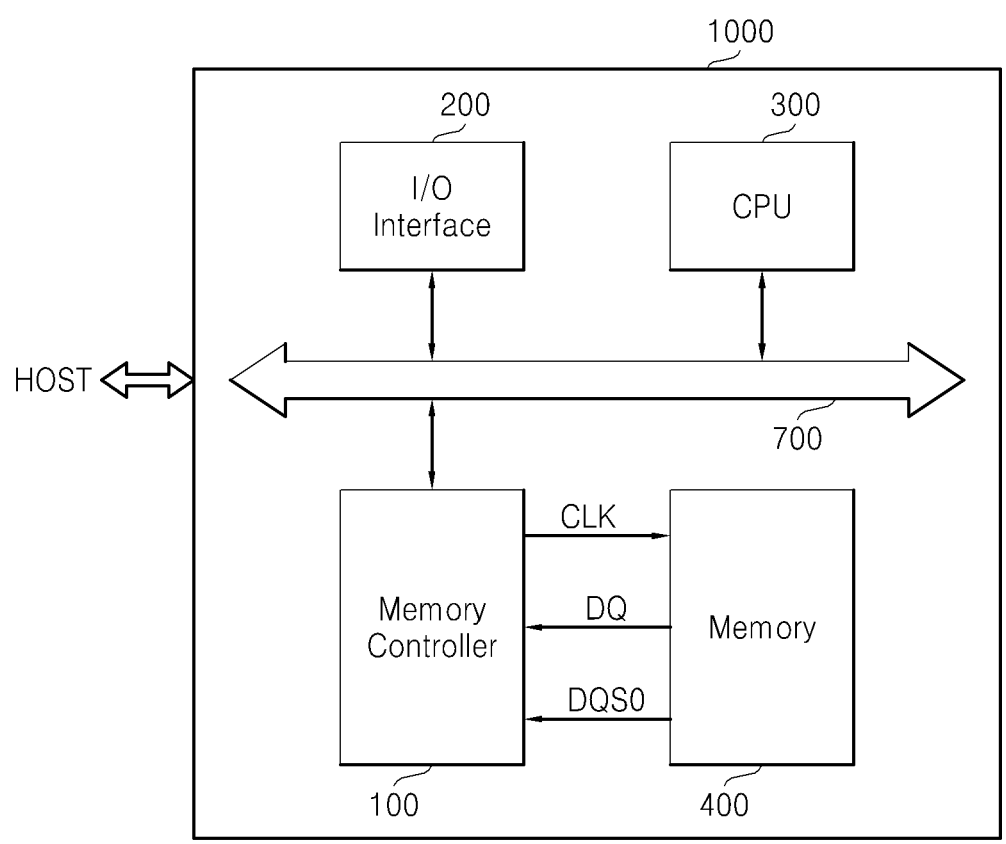
FIG. 1 is a block diagram of an electronic system comprising an output driver according to an embodiment of the inventive concept.

FIG. 1 is a block diagram of an electronic computing system 1000 comprising an output driver according to an embodiment of the inventive concept.

Referring to FIG. 1, electronic system 1000 comprises a memory controller 100, an input/output (I/O) interface 200, a central processing unit (CPU) 300 and a memory 400.

Memory controller 100 performs data access operations on memory 400 in response to commands received from CPU 300. Memory controller 100 provides a clock signal CLK to memory 400 and receives a first data strobe signal DQS0 and data DQ from memory 400 to perform read operations.

I/O interface 200 performs data exchange between a host HOST and electronic system 1000. For example, I/O interface 200 receives a program command and corresponding data from host HOST, and it transmits the program command and/or data to CPU 300 through a data bus 700.

CPU 300 controls operations of memory controller 100 in response to commands received from host HOST. In addition, CPU 300 can control data exchange between host HOST and I/O interface 200. CPU 300 receives a program command and corresponding data transmitted from host HOST through I/O interface 200, and it transmits the program command and/or a control signal to memory controller 100 to program data in memory 400. Accordingly, memory 400 performs program operations to store data in a memory cell array under the control of memory controller 100.

Memory 400 typically takes the form of a volatile memory such as a dynamic random access memory (DRAM) or a static DRAM (SDRAM), or a non-volatile memory such as an electrically erasable programmable read-only memory (EE-PROM), a flash memory, a magnetic RAM (MRAM), a spin-transfer torque MRAM, a conductive bridging RAM (CBRAM), a ferroelectric RAM (FeRAM), a phase change RAM (PRAM) or ovonic unified memory (OUM), a resistive RAM (RRAM or ReRAM), a nanotube RRAM, a polymer RAM (PoRAM), a nano floating gate memory (NFGM), a holographic memory, a molecular electronics memory device, or an insulator resistance change memory.

Figure 2:
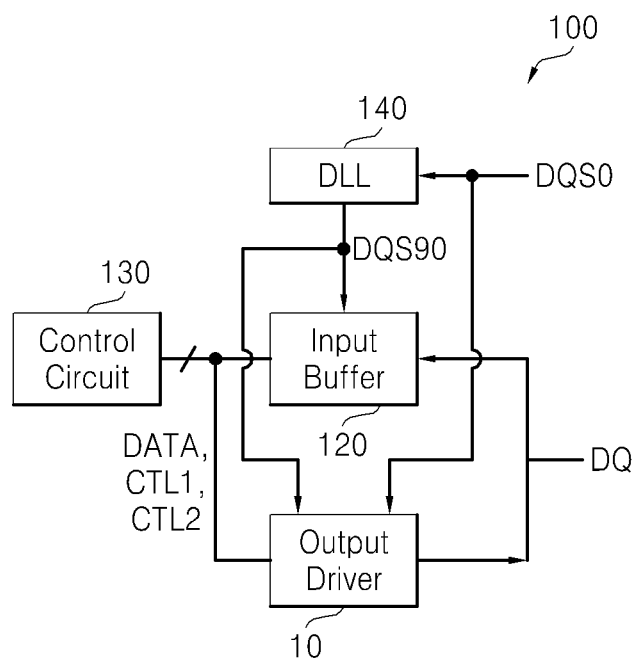
FIG. 2 is a block diagram of a memory controller comprising an output driver according to an embodiment of the inventive concept.

FIG. 2 is a block diagram of a memory controller comprising an output driver according to an embodiment of the inventive concept.

Referring to FIGS. 1 and 2, memory controller 100 comprises an output driver 10, an input buffer 120, a control circuit 130, and a delay locked loop (DLL) 140.

Output driver 10 drives a data signal DATA output from control circuit 130 to transmit data DQ to memory 400. Although output driver 10 is shown in memory controller 110, it can also be included in other features, such as memory 400.

Input buffer 120 receives data DQ from memory 400 according to a first data strobe signal DQS0 and stores data DQ.

Control circuit 130 outputs a plurality of control signals, e.g., CTL1 and CTL2, and a data signal DATA to control input buffer 120 and output driver 10.

DLL 140 receives first data strobe signal DQS0 and outputs a second data strobe signal DS90 having a phase difference of 90° from first data strobe signal DQS0.

Figure 3:
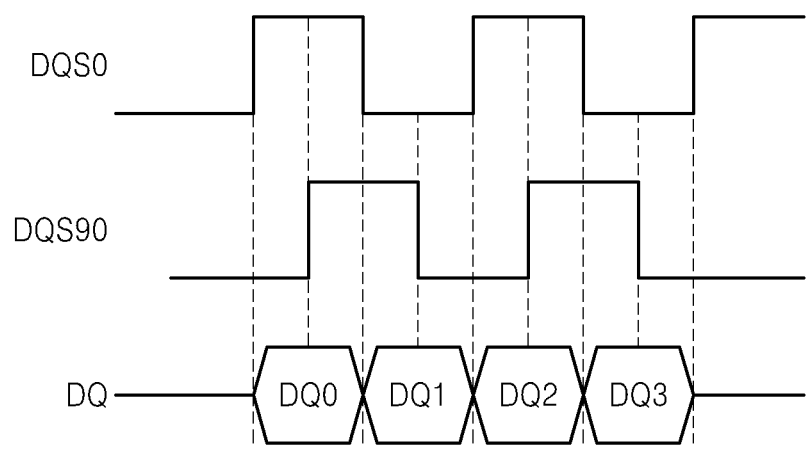
FIG. 3 is a timing diagram of data signals and a data strobe signals illustrated in FIG. 2.

FIG. 3 is a timing diagram of data DQ and data strobe signals DQS0 and DQS90 illustrated in FIG. 2.

Referring to FIGS. 1 through 3, DLL 140 receives first data strobe signal DQS0 and outputs second data strobe signal DQS90 having a phase difference of 90° from first data strobe signal DQS0. Data DQ is input to input buffer 120 according to first data strobe signal DQS0. More specifically, first data DQ0 through fourth data DQ3 are input to input buffer 120.

Figure 4:
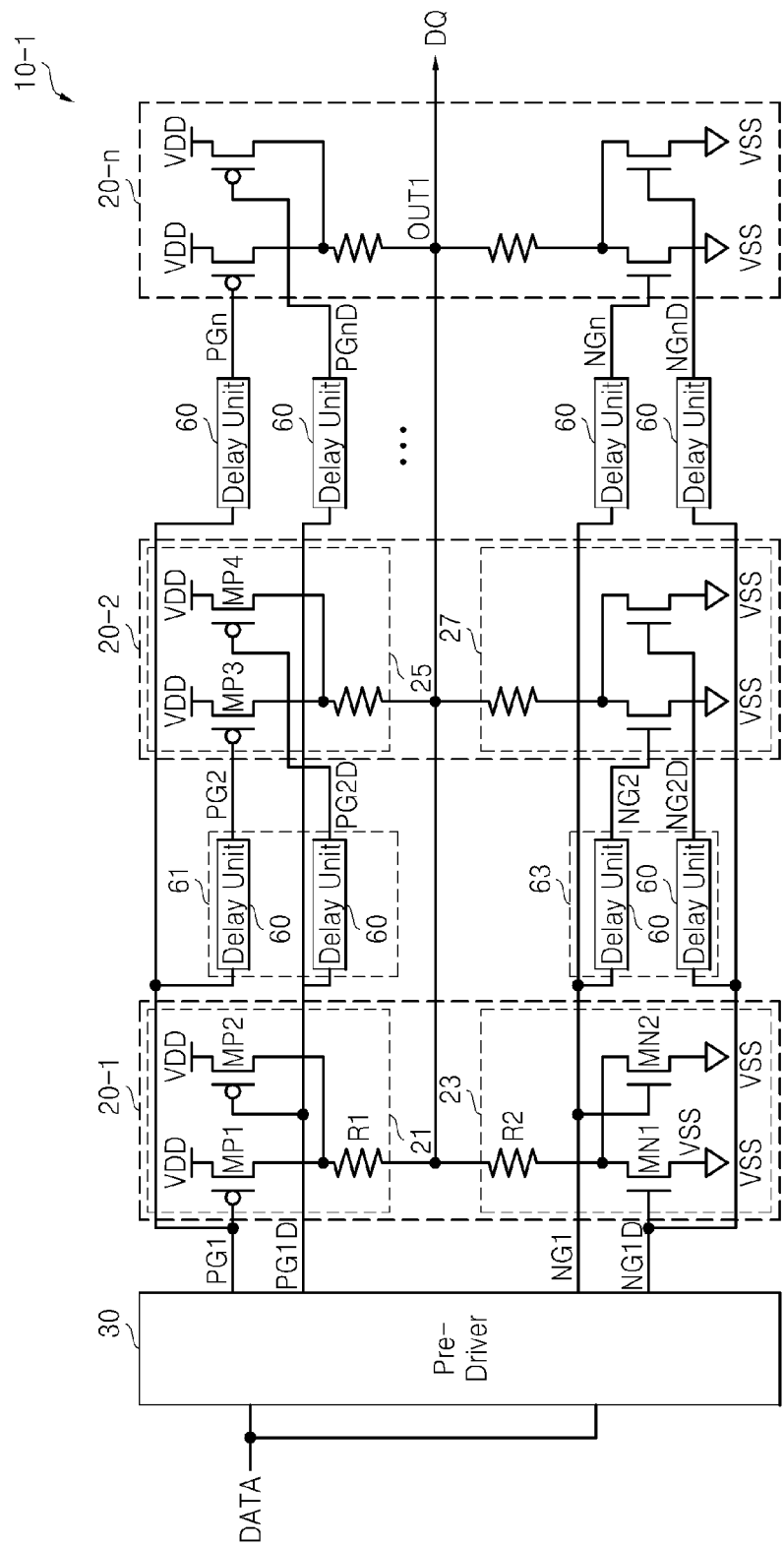
FIG. 4 is a block diagram of the output driver illustrated in FIG. 2 according to an embodiment of the inventive concept.

FIG. 4 is a block diagram of output driver 10 illustrated in FIG. 2 according to an embodiment of the inventive concept. This embodiment of output driver 10 is labeled as output driver 10-1 to distinguish it from other embodiments of output driver 10. A similar numbering convention is used for other embodiments of output driver 10 and other features throughout this description.

Referring to FIG. 4, output driver 10-1 comprises at least one or more driver cells 20-1, 20-2, . . . , or 20-n and a pre-driver 30 for controlling at least one or more driver cells 20-1, 20-2, . . . , or 20-n. These driver cells are similar to each other, so a description of a first driver cell 20-1 will be described as a representative example.

First driver cell 20-1 comprises a pull-up circuit 21 that pulls an output node OUT1 up to a supply voltage VDD in successive intervals defined by a first pull-up control signal PG1 and a second pull-up control signal PG1D having different phases. First driver cell 20-1 further comprises a pull-down circuit 23 that pulls output node OUT1 down to a ground voltage VSS in successive intervals defined by a first pull-down control signal NG1 and a second pull-down control signal NG1D having different phases.

The noise level of output node OUT1 can be decreased by successively pulling output node OUT1 up to the supply voltage or successively pulling output node OUT1 down to the ground voltage, as will be explained, for example, in relation to FIGS. 13A through 14B.

Pull-up circuit 21 comprises a first switch MP1 and a first resistance R1 connected in series between a supply node VDD and output node OUT1, and a second switch MP2 connected in parallel with first switch MP1. In the embodiment of FIG. 4, first and second switches MP1 and MP2 are implemented by PMOS transistors.

Pull-down circuit 23 comprises a second resistance R2 and a third switch MN1 connected in series between output node OUT1 and ground voltage VSS, and a fourth switch MN2 connected in parallel with third transistor MN1. In the embodiment of FIG. 4, third and fourth switches MN1 and MN2 are implemented by NMOS transistors.

Output driver 10-1 further comprises a plurality of delay units 60 to control driver cells 20-1, 20-2, ..., and 20-n in a coordinated manner. For example, output driver 10-1 comprises a first group of delay units 61 delaying pull-up control signals PG1 and PG1D, and a second group of delay units 63 delaying pull-down control signals NG1 and NG1D.

A pull-up circuit 25 of second driver cell 20-2 pulls-up output node OUT1 to supply voltage VDD in response to delayed pull-up control signals PG2 and PG2D having different phases. A pull-down circuit 27 of second driver cell 20-2 pulls-down output node OUT1 to ground voltage VSS in response to delayed pull-down control signals NG2 and NG2D having different phases. Due to the delays of the control signals, operating first driver cell 20-1 and second driver cell 20-2 pull down or pull up output node OUT1 in successive intervals. This can reduce a noise level of an output signal transmitted through output node OUT1 of output driver 10-1.

Numerous changes can be made to output driver 10-1 in alternative embodiments. As an example, driver cells 20-1, 20-2, ..., and 20-n can be designed to have different sizes of transistors. For instance, first and second PMOS transistors MP1 and MP2 of first driver cell 20-1 can be designed to be half the size of third and fourth PMOS transistors MP3 and MP4 of a second driver cell 20-2. Additionally, the number of pull-up control signals PG1 and PG1D and pull-down control signal NG1 and NG1D in output driver 10-1 can be changed. Moreover, the number of parallel PMOS transistors in each pull-up circuit can be changed, and the number of parallel NMOS transistors in each pull-down circuit can be changed.

Figure 5:
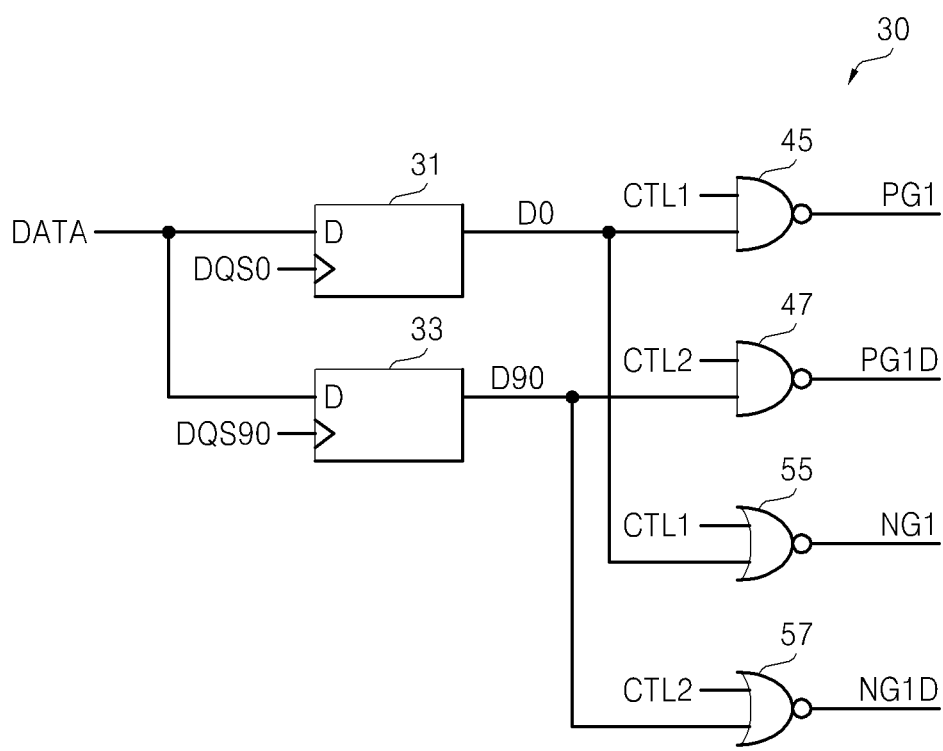
FIG. 5 is a block diagram of a pre-driver illustrated in FIG. 4 according to an embodiment of the inventive concept.
Figure 6:
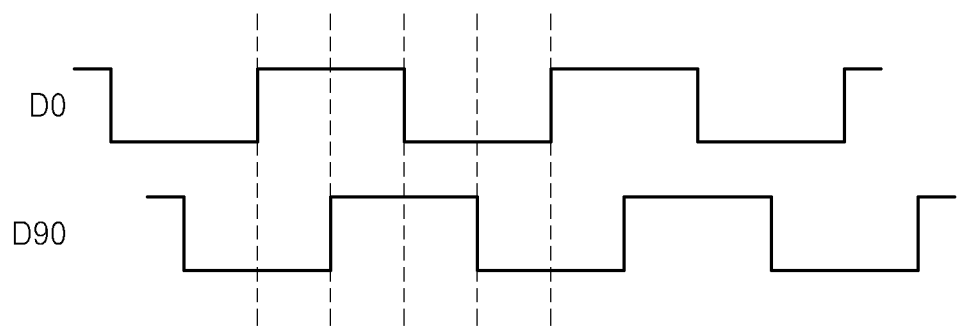
FIG. 6 is a timing diagram of data delay signals illustrated in FIG. 5.

FIG. 5 is a block diagram of pre-driver 30 illustrated in FIG. 4 according to an embodiment of the inventive concept, and FIG. 6 is a timing diagram of first and second data delay signals D0 and D90 illustrated in FIG. 5.

Referring to FIGS. 2 through 5, a pre-driver 30 comprises a plurality of data latches 31 and 33, a plurality of NAND gates 45 and 47, and a plurality of NOR gates 55 and 57.

First data latch 31 receives data signal DATA from control circuit 130, latches data signal DATA in response to first data strobe signal DQS0, and outputs first data delay signal D0. Second data latch 33 latches data signal DATA in response to second data strobe signal DQS90 and outputs a second data delay signal D90.

First data strobe signal DQS0 and second data strobe signal DQS90 have a phase difference of 90°, but this phase difference can be modified in other embodiments. Second data strobe signal DQS90 is produced by changing the phase of first data strobe signal DQS0 through DLL 140. Accordingly, the phase difference can be maintained regardless of variations in process, voltage, and temperature (PVT). In addition, as illustrated in FIG. 6, first and second data delay signals D0 and D90 have a phase difference of 90°.

A first NAND gate 45 outputs a first pull-up control signal PG1 by performing an NAND operation on a first control signal CTL1 and a first data delay signal D0. A second NAND gate 47 outputs a second pull-up control signal PG1D by performing an NAND operation on a second control signal CTL2 and the second data delay signal D90. First NOR gate 55 outputs first pull-down control signal NG1 by performing a NOR operation on first control signal CTL1 and first data delay signal D0. Second NOR gate 57 outputs second pull-down control signal NG1D by performing a NOR operation on a second control signal CTL2 and second data delay signal D90.

A phase difference between pull-up control signals PG1 and PG1D is 90°, and a phase difference between pull-down control signals NG1 and NG1D is 90°. However, in alternative embodiments, the phase differences between pull-up control signals PG1 and PG1D, and between pull-down control signals NG1 and NG1D can be changed.

Control signals CTL1 and CTL2 are output from control circuit 130 and are used to control output driver 10-1. Memory controller 100 can transmit data DQ to an external destination according to control signals CTL1 and CTL2, or it can receive data DQ from an external source.

Figure 7:
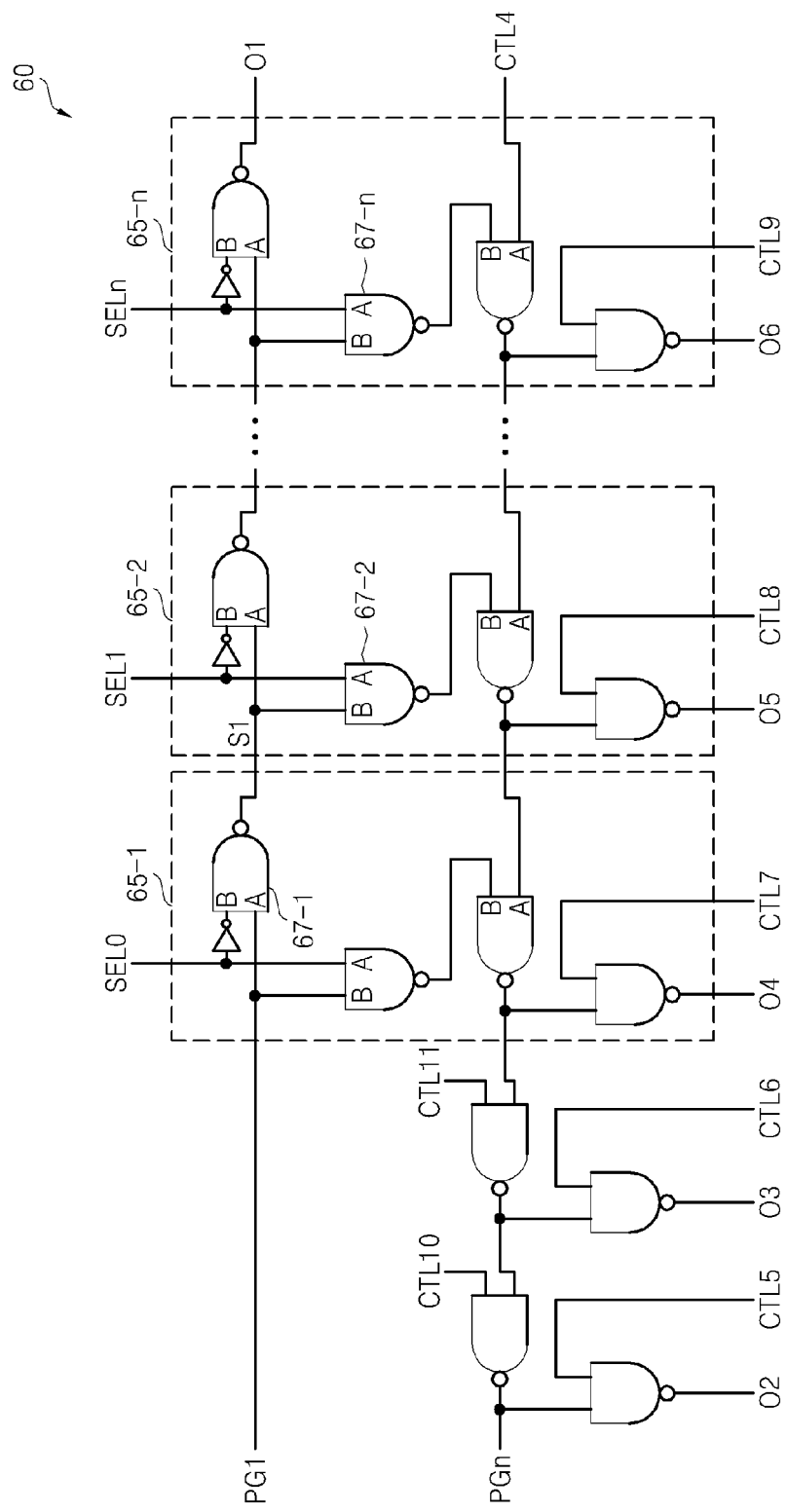
FIG. 7 is a circuit diagram of a delay unit illustrated in FIG. 4 according to an embodiment of the inventive concept.

FIG. 7 is a circuit diagram of a delay unit 60 illustrated in FIG. 4 according to an embodiment of the inventive concept.

Referring to FIGS. 2, 4, and 7, delay unit 60 comprises a plurality of delay blocks 65-1, 65-2, ..., and 65-n. Delay unit 60 delays pull-up control signal PG1 and outputs delayed pull-up control signal Pgn. Alternatively, delay unit 60 can delay a pull-up control signal PG1D or a pull-down control signal NG1 or NG1D, and output a delayed pull-up control signal, e.g., PG2 or PG2D, or a delayed pull-down control signal NG2, NG2D, NGn or NGnD.

Each of delay blocks 65-1, 65-2, ..., and 65-n comprises a plurality of NAND gates, e.g., 67-1, 67-2, ..., and 67-n, and a plurality of inverters. A and B depict each input terminal of plurality of NAND gates.

Pull-up control signal PG1 is input to a first input terminal 'A' of an NAND gate 67-1 belonging to a first delay block 65-1, and an output signal S1 of NAND gate 67-1 is input to a second input terminal 'B' of an NAND gate 67-2 belonging to a second delay block 65-2. Delay unit 60 can be designed to have a constant delay according to delay blocks 65-1, 65-2, ..., and 65-n.

Selection signals SEL0, SEL1, ..., and SELn are used to select a subset of delay blocks 65 to delay pull-up control signal PG1. Selection signals SEL0, SEL1, ..., and SELn are output from control circuit 130. Control signals CTL4, CTL5, ..., and CTL11 are input from an external circuit, e.g., control circuit 130. In addition, delay circuit 60 outputs not only a delayed pull-up control signal Pgn, but also a plurality of output signals O1, O2, ..., and O6.

Figure 8:
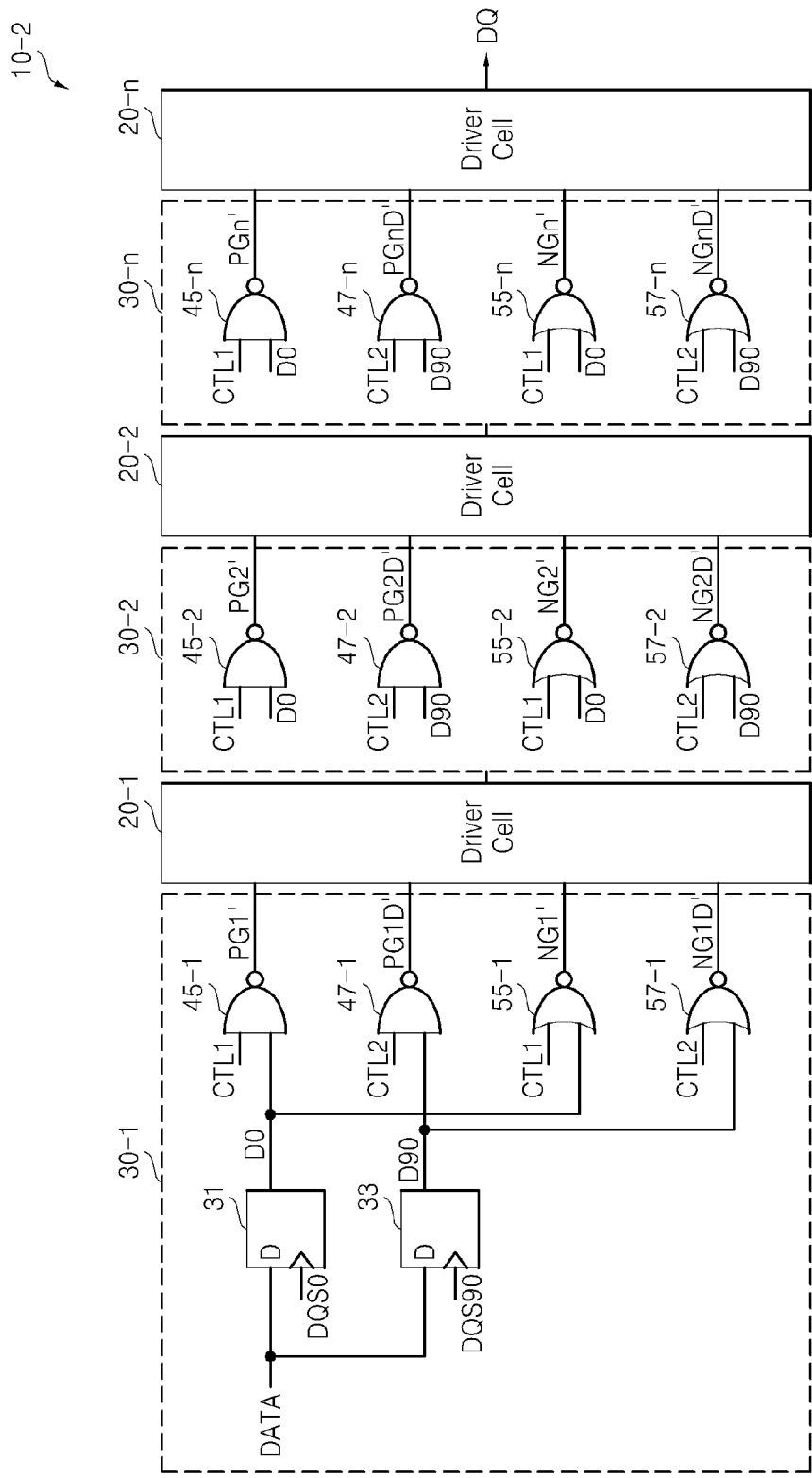
FIG. 8 is a block diagram of the output driver illustrated in FIG. 2 according to another embodiment of the inventive concept.

FIG. 8 is a block diagram of output driver 10 illustrated in FIG. 2 according to another embodiment of the inventive concept. This embodiment is labeled as output driver 10-2.

Referring to FIGS. 2 and 8, output driver 10-2 comprises a plurality of driver cells 20-1, 20-2, ..., and 20-n and a plurality of pre-drivers 30-1, 30-2, ..., and 30-n for controlling driver cells 20-1, 20-2, ..., and 20-n to operate in successive intervals.

Driver cells 20-1, 20-2, ..., and 20-n are the same as driver cells 20-1, 20-2, ..., and 20-n of FIG. 4, so a additional description of these features will be omitted in order to avoid redundancy.

Pre-drivers 30-1 through 30-n are implemented similar to each other, so pre-driver 30-1 will be described as a representative example. Pre-driver 30-1 comprises a first data latch 31 and a second data latch 33. First data latch 31 and second data latch 33 have the same operation and function as first data latch 31 and second data latch 33 illustrated in FIG. 5. First NAND gate 45-1 outputs a first pull-up control signal PG1' by performing an NAND operation on first control signal CTL1 and first data delay signal D0.

Figure 9A:
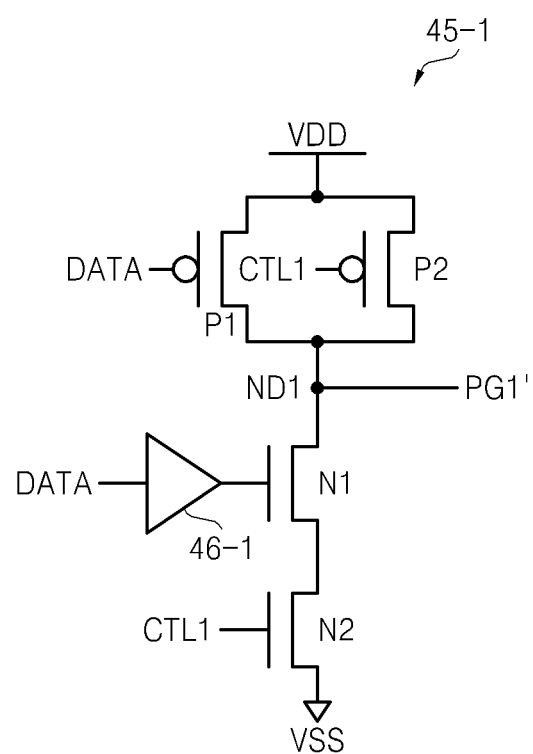
FIG. 9A is a circuit diagram of a NAND gate illustrated in FIG. 8 according to an embodiment of the inventive concept.

FIG. 9A is a circuit diagram of a NAND gate illustrated in FIG. 8 according to an embodiment of the inventive concept.

Referring to FIGS. 8 and 9A, first NAND gate 45-1 comprises two PMOS transistors P1 and P2 connected in parallel between a supply node VDD and a first control signal output node ND1, and two NMOS transistor N1 and N2 connected in series between first control signal output node ND1 and ground voltage VSS. Moreover, first NAND gate 45-1 further comprises a first buffer 46-1 connected to a gate of a first NMOS transistor N1 to delay a data signal DATA.

First PMOS transistor P1 and a first NMOS transistor N1 are controlled by data signal DATA, and second PMOS transistor P2 and second NMOS transistor N2 are controlled by the first control signal CTL1.

Referring to FIG. 8, a second NAND gate 47-1 has the same element as first NAND gate 45-1 except for using a second control signal CTL2 instead of the first control signal CTL1 and operates similarly. first NOR gate 55-1 performs a NOR operation on the first control signal CTL1 and the first data delay signal D0 and outputs a first pull-down control signal NG1'.

Figure 9B:
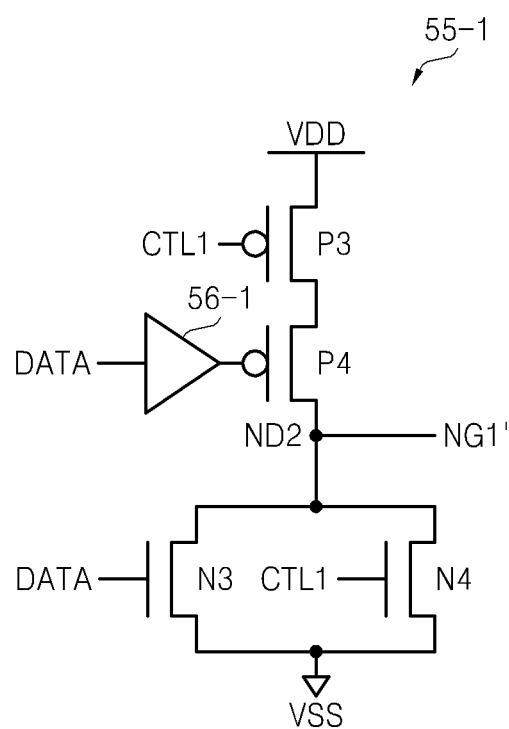
FIG. 9B is a circuit diagram of a NOR gate illustrated in FIG. 8 according to an embodiment of the inventive concept.

FIG. 9B is a circuit diagram of a NOR gate illustrated in FIG. 8 according to an embodiment of the inventive concept.

Referring to FIGS. 8 and 9B, first NOR gate 55-1 comprises two PMOS transistors P3 and P4 connected in series between a supply node VDD and a second control signal output node ND2 and two NMOS transistors N3 and N4 connected in parallel between the second control signal output node ND2 and a ground voltage VSS. First NOR gate 55-1 further comprises a second buffer 56-1 connected to a gate of a fourth PMOS transistor P4 to delay a data signal DATA. Fourth PMOS transistor P4 and third NMOS transistor N3 are controlled by data signal DATA and third PMOS transistor P3 and a fourth NMOS transistor N4 are controlled by a first control signal CTL1. A second NOR gate 57-1 has the same configuration as first NOR gate 55-1 and operates similarly.

Third NAND gate 45-2 performs an NAND operation on first control signal CTL1 and first data delay signal D0 and outputs a second pull-up control signal PG2'.

Figure 10A:
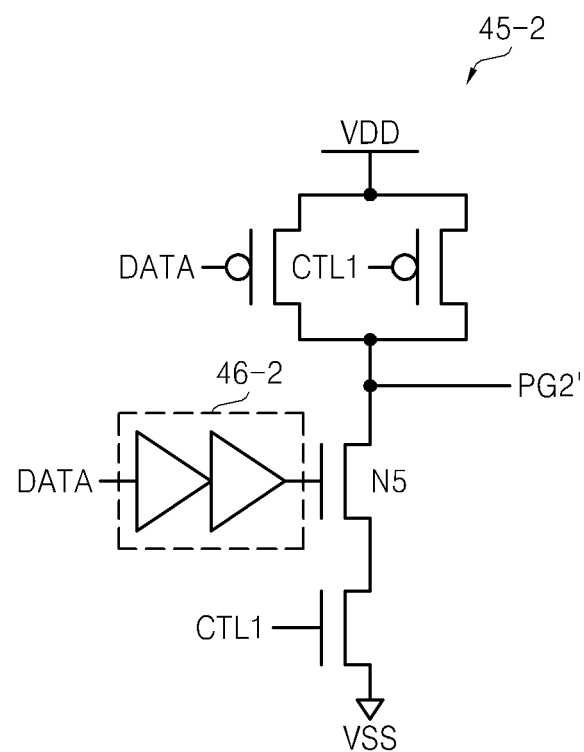
FIG. 10A is a circuit diagram of a NAND gate illustrated in FIG. 8 according to an embodiment of the inventive concept.

FIG. 10A is a circuit diagram of a NAND gate illustrated in FIG. 8 according to an embodiment of the inventive concept.

Referring to FIGS. 8 and 10A, a structure of third NAND gate 45-2 is similar to the structure of first NAND gate 45-1, except that third NAND gate 45-2 comprises two buffers 46-2 connected to a gate of a fifth NMOS transistor N5 instead of first buffer 46-1.

In FIG. 8, fourth NAND gate 47-2 has the same structure as third NAND gate 45-2 except that it operates on second control signal CTL2 instead of first control signal CTL1. A third NOR gate 55-2 performs a NOR operation on first control signal CTL1 and first data delay signal D0, and outputs a second pull-down control signal NG2'.

Figure 10B:
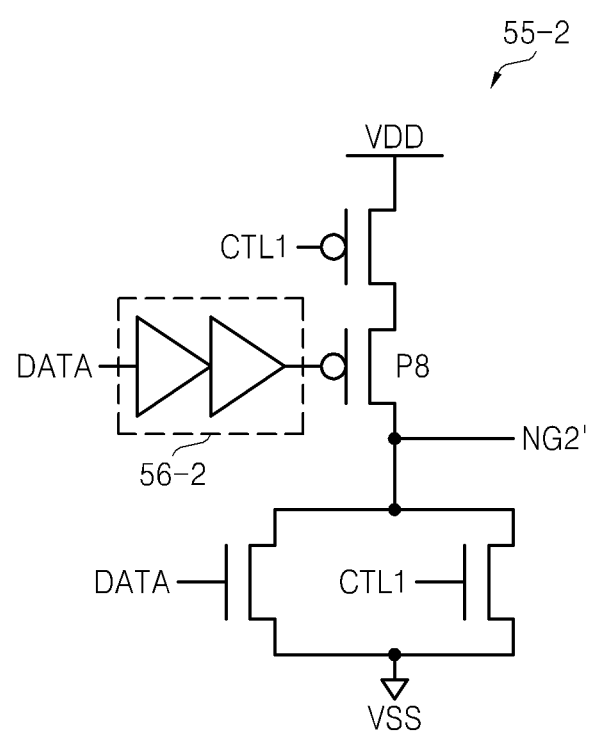
FIG. 10B is a circuit diagram of a NOR gate illustrated in FIG. 8 according to an embodiment of the inventive concept.

FIG. 10B is a circuit diagram of a NOR gate illustrated in FIG. 8 according to an embodiment of the inventive concept.

Referring to FIGS. 8 and 10B, third NOR gate 55-2 has a structure similar to first NOR gate 55-1. However, third NOR gate 55-2 comprises two buffers 56-2 connected to a gate of an eighth PMOS transistor P8 instead of a second buffer 56-1.

In FIG. 8, a fourth NOR gate 57-2 has the same structure as third NOR gate 55-2 and operates similarly. A fifth NAND gate 45-n performs an NAND operation on first control signal CTL1 and first data delay signal D0 and outputs an $n^{th}$ pull-up control signal PGn'.

Figure 11A:
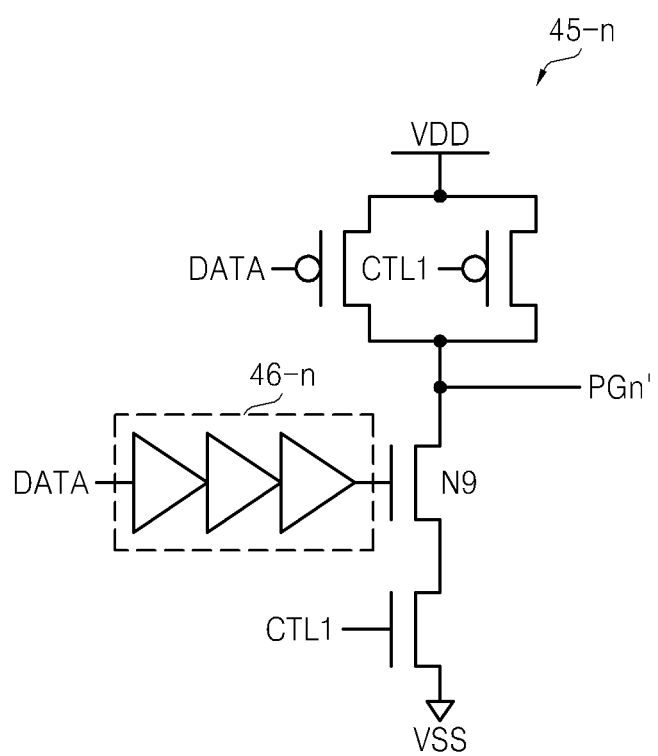
FIG. 11A is a circuit diagram of a NAND gate illustrated in FIG. 8 according to an embodiment of the inventive concept.

FIG. 11A is a circuit diagram of a NAND gate illustrated in FIG. 8 according to an embodiment of the inventive concept.

Referring to FIGS. 8 and 11A, a fifth NAND gate 45-n has a configuration similar to first NAND gate 45-1. However, fifth NAND gate 45-n comprises three buffers 46-n connected to a gate of a ninth NMOS transistor N9 instead of a first buffer 46-1.

In FIG. 8, a sixth NAND gate 47-n has the same structure as fifth NAND gate 45-n except that it operates on second control signal CTL2 instead of first control signal CTL1. A fifth NOR gate 55-n performs a NOR operation on first control signal CTL1 and first data delay signal D0 and outputs an $n^{th}$ pull-down control signal NGn'.

Figure 11B:
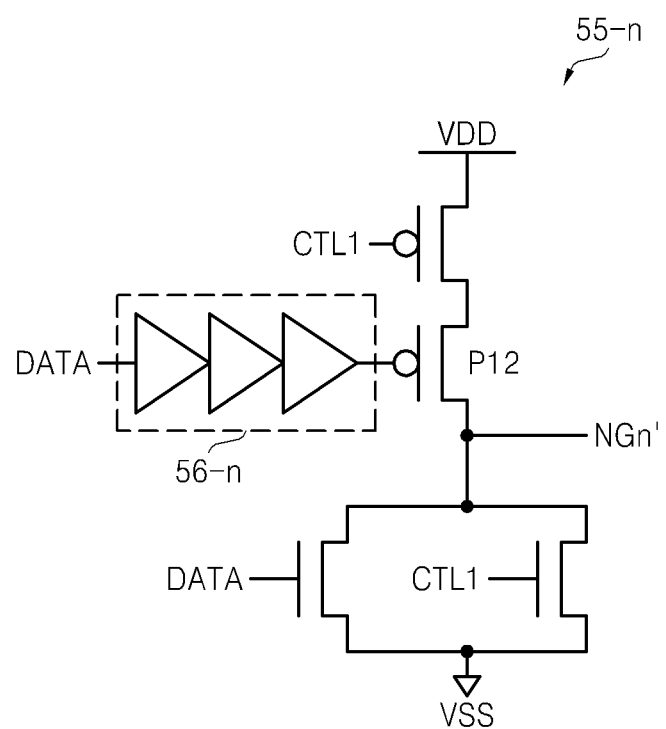
FIG. 11B is a circuit diagram of the NOR gate illustrated in FIG. 8 according to an embodiment of the inventive concept.

FIG. 11B is a circuit diagram of a NOR gate illustrated in FIG. 8 according to an embodiment of the inventive concept.

Referring to FIGS. 8 and 11B, fifth NOR gate 55-n has a configuration similar to first NOR gate 55-1. However, fifth NOR gate 55-n comprises three buffers 56-n connected to a gate of a twelfth PMOS transistor P12 instead of a second buffer 56-1.

In FIG. 8, a sixth NOR gate 57-n has the same structure as fifth NOR gate 55-n.

Figure 12:
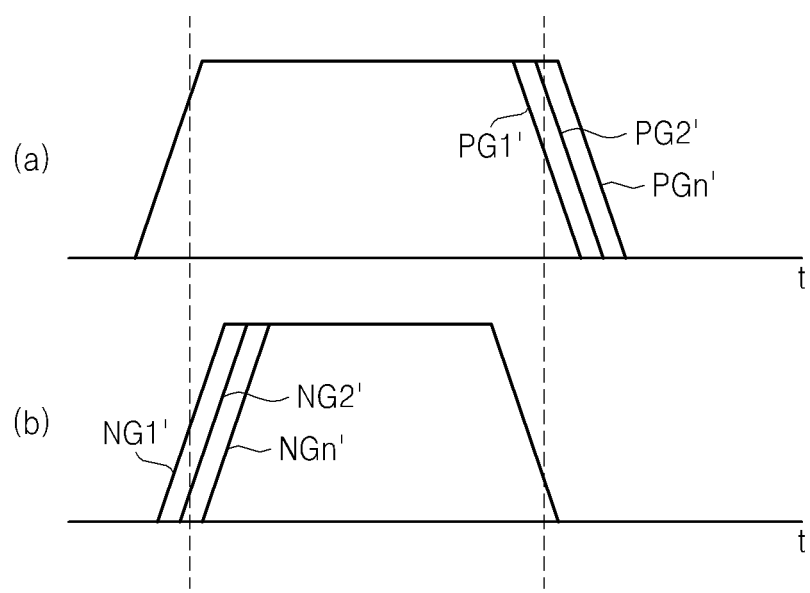
FIG. 12 shows (a) a timing diagram of an output signal of the NAND gate illustrated in FIGS. 9A, 10A, and 11A, and (b) a timing diagram of an output signal of the NOR gate illustrated in FIGS. 9B, 10B and 11B.

FIG. 12 shows (a) a timing diagram of an output signal of an NAND gate illustrated in FIGS. 9A, 10A and 11A, and (b) a timing diagram of an output signal of a NOR gate illustrated in FIGS. 9B, 10B and 11B.

Referring to FIG. 8 and FIG. 12(a), NAND gates (e.g., 45-1, 45-2 and 45-n) of different driver cells 20-1, 20-2, ..., and 20-n have different configurations. For example, first NAND gate 45-1 comprises a buffer 46-1, a third NAND gate 45-2 comprises two buffers 56-2 and fifth NAND gate 45-n comprises three buffers. Accordingly, each of NAND gates 45-1, 45-2, and 45-n outputs each of pull-up control signals PG1', PG2' and PGn' in successive intervals rather than simultaneously.

Similarly, each of NOR gates 55-1, 55-2 and 55-n outputs one of pull-down signal NG1', NG2' and NGn' in successive intervals rather than simultaneously. By operating driver cells 20-1, 20-2, ..., and 20-n in successive intervals, output driver 10-2 can reduce noise in its output.

Figure 13A:
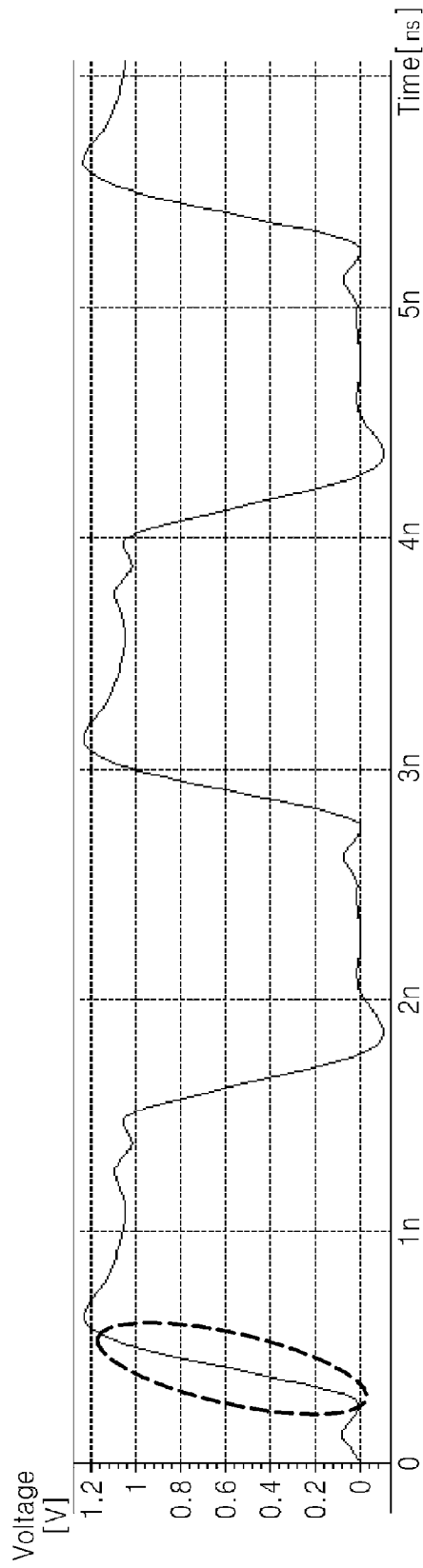
FIG. 13A is a voltage diagram of a signal output from an output node of a conventional output driver.
Figure 13B:
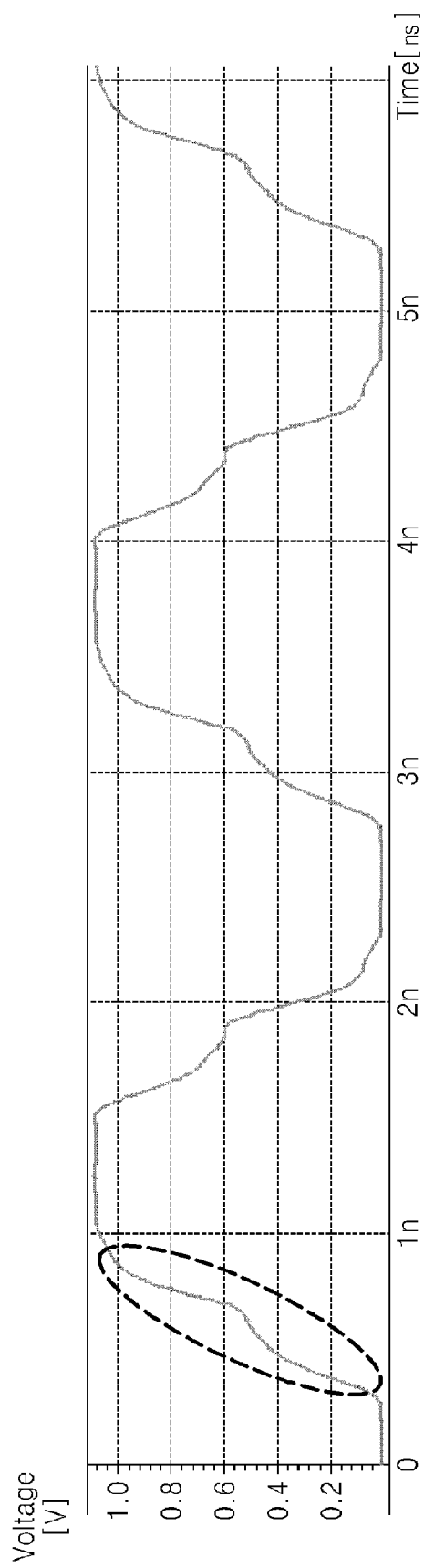
FIG. 13B is a voltage diagram of a signal output from an output node of an output driver according to an embodiment of the inventive concept.

FIG. 13A is a voltage diagram of a signal output from an output node of a conventional output driver, and FIG. 13B is a voltage diagram of a signal output from an output node of an output driver according to an embodiment of the inventive concept.

Referring to FIGS. 4 through 13B, a waveform slope of a signal output from an output node OUT1 of an output driver 10-1 or 10-2 is smaller than a waveform slope of a signal output from an output node of a conventional output driver. This is because output driver 10-1 or 10-2 (1) pulls-up output node OUT1 to a supply voltage in successive intervals in response to first pull-up control signal PG1 and second pull-up control signal PG1D, which have different phases, or pulls down output node OUT1 to a ground voltage, (2) operates each of a plurality of driver cells 20-1, 20-2, ..., and 20-n in succession by using delay unit 61, or (3) operates each of the plurality of driver cells 20-1, 20-2, ..., and 20-n in succession by using a plurality of pull-up control signals PG1', PG1D', PG2', PG2D', ..., PGn' and PGnD' and a plurality of pull-down control signals NG1', NG1D', NG2', NG2D', ..., NGn' and NGnD', which have different phases.

Figure 13C:
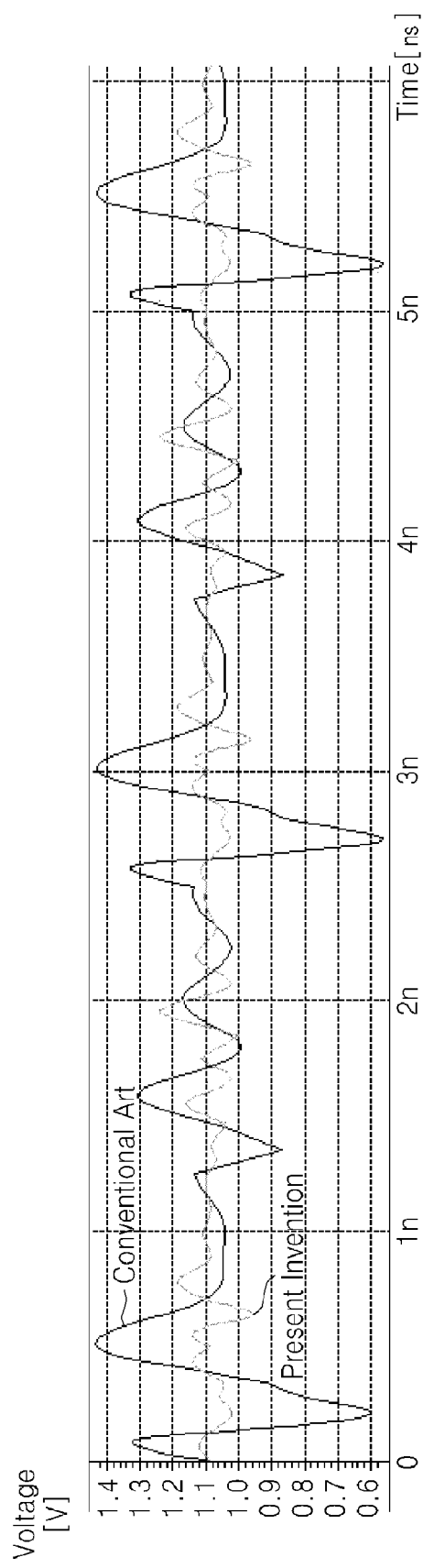
FIG. 13C is a voltage diagram showing a comparison between noise in a supply voltage of a conventional output driver and noise in an output driver according to an embodiment of the inventive concept.
Figure 13D:
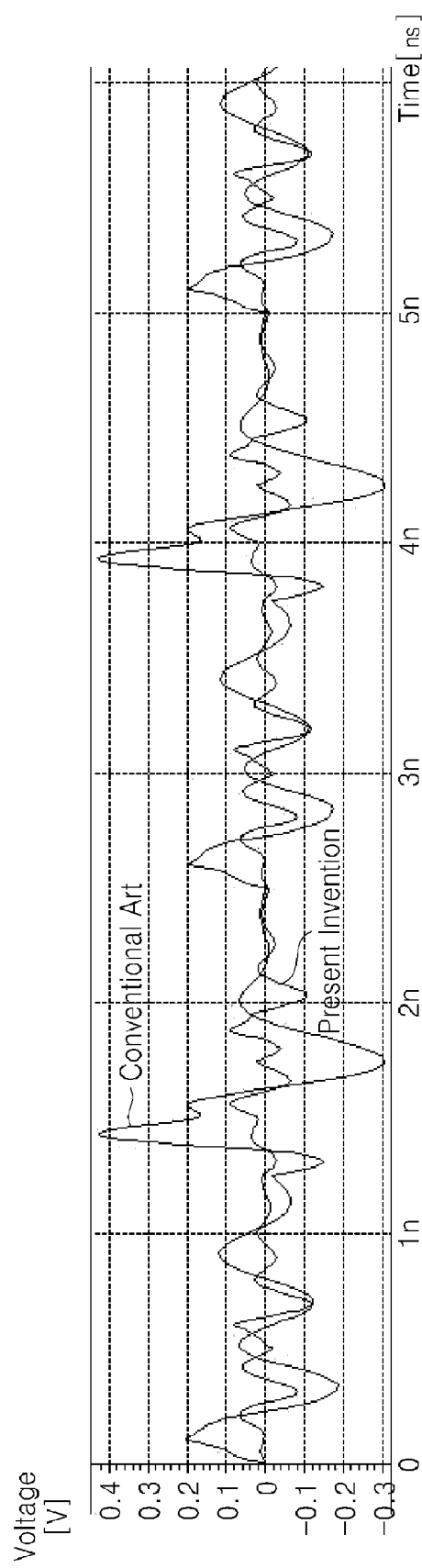
FIG. 13D is a voltage diagram showing a comparison between noise in a ground voltage of a conventional output driver and noise in an output driver according to an embodiment of the inventive concept.

FIG. 13C is a voltage diagram showing a comparison between noise in a supply voltage of a conventional output driver and noise in an output driver according to an embodiment of the inventive concept, and FIG. 13D is a voltage diagram showing a comparison between noise in a ground voltage of a conventional output driver and noise in an output driver according to an embodiment of the inventive concept. A dotted line of FIGS. 13C and 13D represents noise in the conventional output driver and a solid line represents noise of the output driver according to an embodiment of the inventive concept. Noise of the supply voltage or a noise of the ground voltage can be expressed as $-L*di/dt$, where L is inductance of bond wires of output driver 10-1 or 10-2 and/or inductance of a lead frame, and di/dt is variation of current over time.

Referring to FIGS. 13C and 13D, noise of the supply voltage and noise of the ground voltage in the output driver of the inventive concept are smaller than noise of the supply voltage and a noise of the ground voltage of the conventional output driver.

Figure 14A:
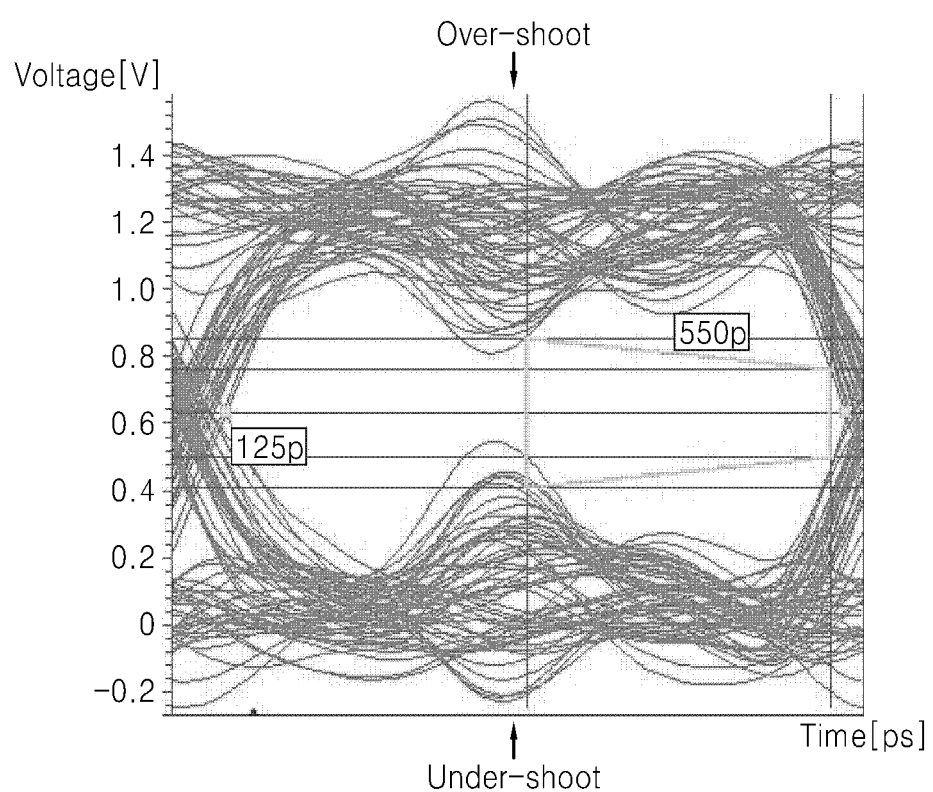
FIG. 14A is an eye diagram of a signal output from a conventional output driver.
Figure 14B:
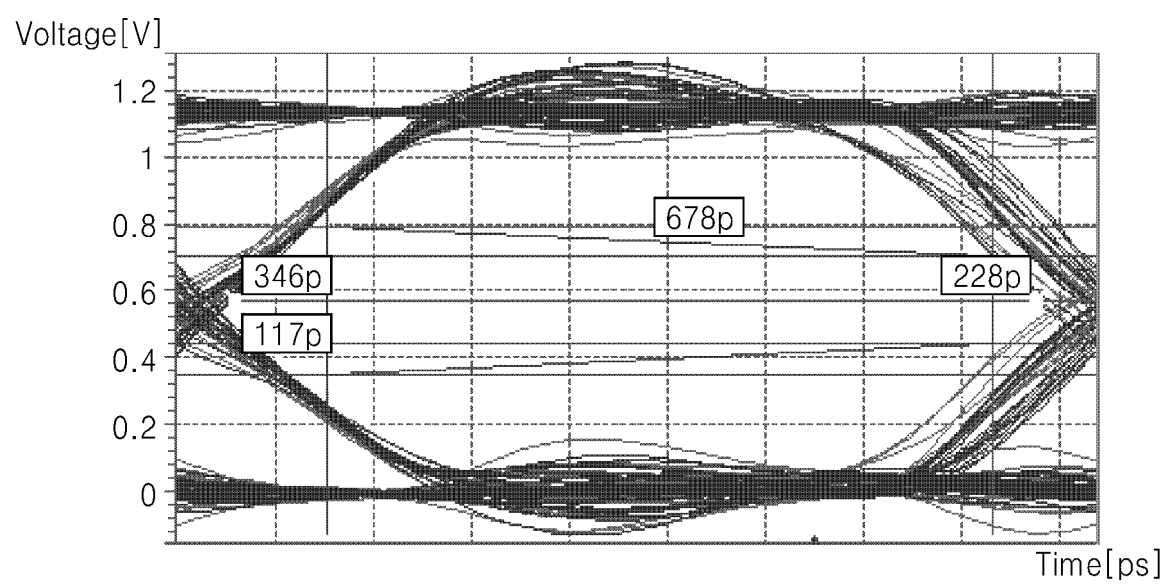
FIG. 14B is an eye diagram of a signal output from an output driver according to an embodiment of the inventive concept.

FIG. 14A is an eye diagram of a signal output from the conventional output driver, and FIG. 14B is an eye diagram of a signal output from the output driver of the inventive concept. The signal depicts a supply voltage or a ground voltage.

Referring to FIGS. 14A and 14B, over-shoot, under-shoot and eye opening are improved in FIG. 14B. The over-shoot and the under-shoot mean peak distortion induced by signal interruptions. The eye opening means height between peaks.

As indicated by the foregoing, an output driver according to various embodiments of the inventive concept can reduce noise in an output signal by using a plurality of signals each having a different phase.

Although a few embodiments of the inventive concept have been shown and described, those skilled in the art will appreciate that changes can be made to these embodiments without departing from the scope of the inventive concept as defined by the attached claims and their equivalents.

What is claimed is:

1. An output driver, comprising:
a first pull-up circuit that pulls an output node up to a supply voltage in N successive intervals in response to N pull-up control signals having different phases;
a first pull-down circuit that pulls the output node down to a ground voltage in M successive intervals in response to M pull-down control signals having different phases;
a first group of delay units for delaying the N pull-up control signals;
a second group of delay units for delaying the M pull-down control signals;
a second pull-up circuit pulling-up the output node to the supply voltage in N successive intervals in response to the delayed N pull-up control signals having different phases; and
a second pull-down circuit pulling-down the output node to the ground voltage in M successive intervals in response to the delayed M pull-down control signals having different phases,
wherein N=2 and the N pull-up control signals have a phase difference of 90°, or M=2 and the M pull-down control signals have a phase difference of 90°.

2. The output driver of claim 1, further comprising:
a pre-driver, comprising:
a plurality of data latches each latching a data signal in response to one of a plurality of data strobe signals having different phases and outputting one of a plurality of data delay signals;
a plurality of NAND gates each performing a NAND operation on one of a plurality of control signals and one of the plurality of data delay signals and outputting each of the two pull-up control signals; and
a plurality of NOR gates each performing a NOR operation on one of the plurality of control signals and one of the data delay signals and outputting one of the M pull-down control signals.

3. The output driver of claim 1, wherein the first pull-up circuit comprises a plurality of switches each pulling-up the output node to the supply voltage in response to one of the N pull-up control signals.

4. The output driver of claim 1, wherein the first pull-down circuit comprises a plurality of switches each pulling-down the output node to the ground voltage in response to one of the M pull-down control signals.

5. The output driver of claim 1, wherein the first group of delay units comprise NAND gates, and the second group of delay units comprise inverters.

6. An output driver, comprising:
a plurality of driver cells; and
a plurality of pre-drivers connected to the plurality of driver cells and configured to control the plurality of driver cells to operate in succession,
wherein each of the plurality of driver cells comprises:
a first pull-up circuit pulling-up an output node to a supply voltage in N successive intervals in response to N pull-up control signals having different phases; and
a first pull-down circuit pulling-down the output node to a ground voltage in M successive intervals in response to M pull-down control signals having different phases;
wherein each of the plurality of pre-drivers comprises:
a plurality of NAND gates each performing an NAND operation on one of a plurality of control signals and a data signal; and
a plurality of NOR gates each performing a NOR operation on one of the plurality of control signals and the data signal.

7. The output driver of claim 6, wherein N=2 and a phase difference between the N pull-up control signals is 90°, or M=2 and a phase difference between the M pull-down control signals is 90°.

8. The output driver of claim 6, wherein each of plurality of NAND gates comprises a plurality of transistors, and at least one buffer connected to a gate of one of the plurality of transistors to delay the data signal.

9. The output driver of claim 6, wherein each of plurality of NOR gates comprises a plurality of transistors, and at least one buffer connected to a gate of one of the plurality of transistors to delay the data signal.

10. An electronic system, comprising:
a memory device that generates a first data strobe signal; and
a memory controller that receives the first data strobe signal and transmits data to the memory device in synchronization with the first data strobe signal, wherein the memory controller comprises a delay locked loop that phase-shifts the first data strobe signal by 90° to generate a second data strobe signal, and an output driver having an output node that receives the data, transmits the data to an output node, and connects the output node to a supply voltage during each of N successive intervals determined by the phase difference between the first and second data strobe signals, and further connects the output node to a ground voltage during each of M successive intervals determined by the phase difference between the first and second data strobe signals.

11. The electronic system of claim 10, further comprising a control circuit that transmits the data and control signals to the memory controller, wherein the control signals are used to control the timing of the N successive intervals and the M successive intervals.

12. The electronic system of claim 10, wherein the memory device is a nonvolatile memory device.

13. The electronic system of claim 10, wherein the output driver comprises a pull-up circuit that pulls the output node up to the supply voltage in the N successive intervals in response to N pull-up control signals having different phases, and a pull-down circuit that pulls the output node down to the ground voltage in the M successive intervals in response to M pull-down control signals having different phases.

14. The electronic system of claim 13, wherein N=2 and the N pull-up control signals have a phase difference of 90°, or M=2 and the M pull-down control signals have a phase difference of 90°.

15. The electronic system of claim 10, wherein the output driver further comprises:
a first data latch latching the data in response to the first data strobe signal, and outputting a first data delay signal;
a second data latch latching the data in response to the second data strobe signal, and outputting a second data delay signal;
a first NAND gate performing a NAND operation on a first control signal and the first data delay signal and outputting a first one of the N pull-up control signals;
a second NAND gate performing a NAND operation on a second control signal and the second data delay signal and outputting a second one of the N pull-up control signals;
a first NOR gate performing a NOR operation on the first control signal and the first data delay signal and outputting a first one of the M pull-down control signals;
a second NOR gate performing a NOR operation on the second control signal and the second data delay signal and outputting a second one of the M pull-down control signals.

16. The electronic system of claim 13, wherein the pull-up circuit comprises a plurality of switches each pulling-up the output node to the supply voltage in response to one of the N pull-up control signals.

17. The electronic system of claim 13, wherein the pull-down circuit comprises a plurality of switches each pulling-down the output node to the ground voltage in response to one of the M pull-down control signals.

* * * * *